United States Patent [19]
Verwegen

[11] Patent Number: 6,147,546
[45] Date of Patent: Nov. 14, 2000

[54] ZERO VOLT/ZERO CURRENT FUSE ARRANGEMENT

[75] Inventor: Peter Verwegen, Rottenburg, Germany

[73] Assignee: International Business Machines Corporation, Armonk, N.Y.

[21] Appl. No.: 09/050,537

[22] Filed: Mar. 30, 1998

[30] Foreign Application Priority Data

Mar. 11, 1998 [EP] European Pat. Off. .............. 98104334

[51] Int. Cl.[7] .................................................. H01H 37/76
[52] U.S. Cl. ............................ 327/525; 327/200; 365/96; 365/225.7
[58] Field of Search ..................................... 327/525, 526, 327/545, 403, 404, 199, 200, 198; 365/225.7, 96, 200; 326/49, 50

[56] References Cited

U.S. PATENT DOCUMENTS

| | | | |
|---|---|---|---|
| 5,422,850 | 6/1995 | Sukegawa et al. | 365/200 |
| 5,457,656 | 10/1995 | Fu | 365/225.7 |
| 5,731,734 | 3/1998 | Pathak et al. | 327/525 |
| 5,818,793 | 10/1998 | Toda et al. | 365/225.7 |

*Primary Examiner*—Timothy P. Callahan
*Assistant Examiner*—Minh Nguyen
*Attorney, Agent, or Firm*—Lynn L. Augspurger

[57] ABSTRACT

A zero volt/zero current fuse arrangement included of two coupled latches is provided, especially for use with interconnect layers made of copper, which prevents the dendritic growth of copper and thus reduces the possibility of "regrowing" the fuse after it has been blown.

3 Claims, 2 Drawing Sheets

ZERO VOLT/ZERO CURRENT FUSE ARRANGEMENT

BACKGROUND OF THE INVENTION

1. Technical Field

The present invention generally relates to integrated circuits, and more specifically to those integrated circuits that use copper for the interconnect layers. Still more specifically, this invention relates to integrated circuits that incorporate fuse technology.

2. Background Art

As microprocessor makers move towards new generations of processes, e.g., the 0.18 μm CMOS process, new materials for the interconnect layers must be chosen to decrease their resistance. The use of copper in place of the traditional aluminum is considered by most chip manufacturers.

Copper, however, has one major disadvantage for integrated circuits: it has a higher mobility in silicon than aluminum. If opper atoms are left on their own, they would spread throughout the chip, ultimately contaminating the transistors and preventing them from operating properly.

An important feature of integrated circuit designs is fuse technology. That is, a large number of integrated circuit designs now include fuses to implement certain features or to achieve desired results. For example, for many years dynamic random access memories (DRAMs) have included spare word lines and bit lines that can be substituted through fuse technology for faulty lines. On some integrated circuits, fuses are used to customize the chip function after manufacture. Fuses may also be used to trim precision components such as resistors or capacitors.

A fuse has two possible states: the first state, when the fuse is intact; and the second or "blown" state, when the fuse is blown or broken down. A fuse is typically blown through laser ablation or by forcing an excessive current through a narrow on-chip fuse wire. When either of these techniques is used, not only is the dielectric encapsulation or protective covering around the fuse ruptured, which allows the metallic or similar material of the fuse to escape, but any other anti-corrosive material around the fuse is also ruptured.

Fuses are typically formed in the topmost layer metal wires where they can be easily accessed for laser programming and from where the metallic material of the fuse can easily escape. In the past, the material used for for fuses has been aluminum, which produces an oxide that is largely self passivating, thus preventing the fuse from "regrowing". Examples of this type of and similar types of fuses are found in the following U.S. patents: U.S. Pat. No. 5,291,139, "Circuit for Detection of the State of an Integrated Circuit Fuse in a Balanced Fuse Configuration", issued March 1994 to Fruhauf et al., and U.S. Pat. No. 5,404,049, "Fuse Blow Circuit", issued April 1995 to Canada et al.

As already mentioned before, future integrated circuits are progressing towards the use of other types of metals for wiring and fuses, such as copper, to allow for a smaller resistance in the circuit. Unfortunately, though, copper does not produce self-passivating oxides and thus is subject to dendritic growth, which can "regrow" a blown fuse, defeating the purpose of the fuse. In Linley Gwennap, "IC Makers Confront RC Limitations", Microprocessor Report, Aug. 4, 1997, there is disclosed a barrier solution that envelopes all copper traces inside a protective sheath. This cladding keeps the copper away from all silicon structures and thus prevents oxidation. This solution is a major progress when intending to use copper instead of aluminum. However, since there is no barrier between the two ends of the blown fuse any longer, and the distance between those ends is very small, the fuse could repair itself because of the mobility of the copper atoms.

Exposed copper is also subject to corrosion. Corrosion may enter the copper at the ruptured site and proceed to follow the wire to a junction where it will interrupt a device or circuit that is intended to remain conductive. Although the aforementioned patents disclose methods to detect the integrity of fuses, they do not disclose a method for preventing dendritic growth or corrosion in a blown fuse.

U.S. patent application 914,857, filed Aug. 19, 1997 and assigned to the same assignee as the present invention, discloses a voltage limiting circuit for fuse technology. An integrated circuit comprises a fuse having two terminals and a voltage limiting circuit that is coupled to the terminals. The voltage limiting circuit is responsive to a fuse blow through a low impedance sensing circuit, and then minimizes the voltage across the fuse gap that is created by the fuse blow. Thus, dendritic growth as well as corrosion in copper or similar types of fuses is reduced.

However, this solution still suffers from several drawbacks. First, the voltage is only limited to a few hundreds of mV and the current is in the nA to μA range. Since there is still a voltage present, the possibility remains that copper atoms will spread over the very small distance between the two ends of the blown fuse and thus "regrow" the fuse. This will be the more damaging, the more advanced the processes will become.

Secondly, the impedance of the proposed sensing circuit is no larger than is needed to reliably sense the state of the fuse. This means that the impedances and the sensing circuit must be well designed to function correctly and will have to change from technology to technology.

Finally, the solution favors two current sources. The design of these current sources will consume a lot of silicon.

SUMMARY OF THE INVENTION

It is thus an object of the present invention to provide a fuse arrangement that will have zero voltage across a blown fuse.

It is another object of the present invention to provide a fuse arrangement that, apart from power on, will not draw any DC current.

It is still another object of the invention to provide a fuse arrangement that could be used with interconnect lines made of copper.

It is still a further object of the invention to provide a fuse arrangement that is not timing critical.

It is still another object of the invention to provide a fuse arrangement that prevents dendritic growth in a blown fuse.

Dendritic growth is stimulated by enhanced temperature, humidity and/or by the electric field. The first two factors, namely enhanced temperature and humidity cannot be controlled in such a way that dendritic growth can be eliminated. Hence, the voltage and consequently the electric field has to be reduced to zero.

The foregoing and other objects and advantages of the present invention will be apparent from the following detailed description in combination with the accompanying drawings.

DETAILED DESCRIPTION OF THE PREFERRED EMBODIMENT

Figure 1:
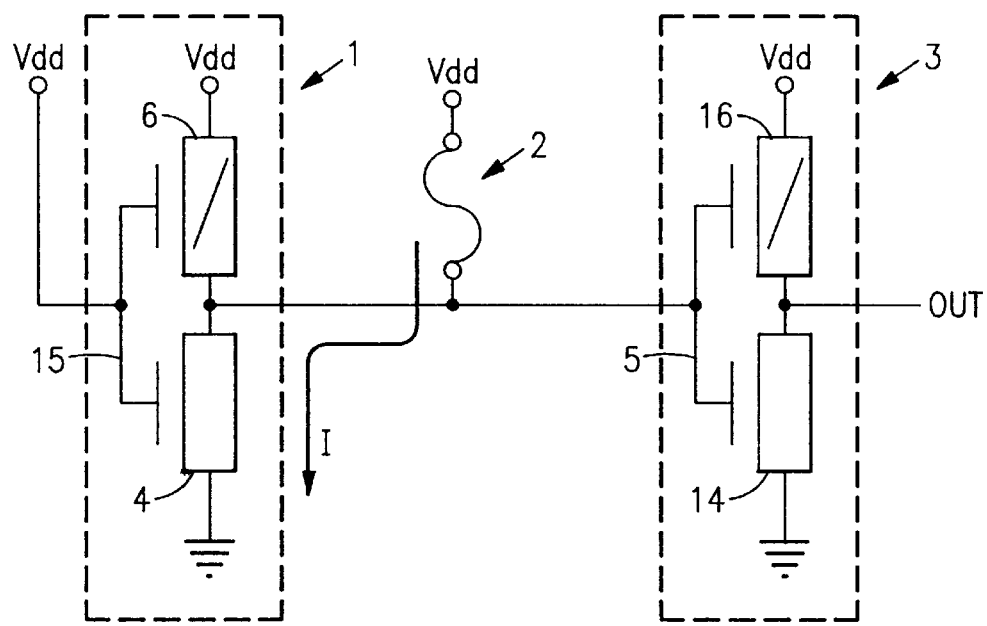
FIG. 1 is a block diagram of the design of a typical state of the art fuse arrangement in CMOS technology.

Referring now to FIG. 1, a block diagram of a design of a typical state of the art fuse arrangement in CMOS technology is disclosed.

When the fuse 2 is intact, the output ("OUT" in FIG. 1) of the second inverter 3 is logical "0", because the fuse connects the gate 5 of inverter 3 low-ohmically with the circuit supply voltage Vdd. Obvious is a DC current flow (demonstrated by the broad black arrow in FIG. 1) through the fuse 2 and the NFET 4 of the first inverter 1.

Figure 2:
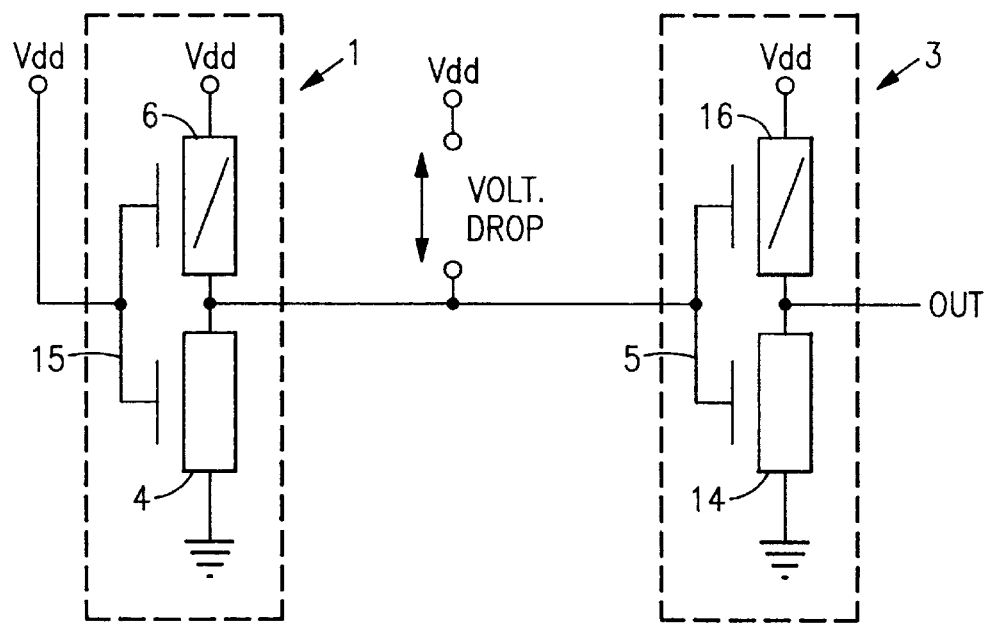
FIG. 2 is a block diagram of the design of FIG. 1 with a blown fuse.

Referring to FIG. 2, when the fuse is blown, the output of the first inverter 1 is allowed to go to a logical "0", because the gate 15 of this inverter is tied to the circuit supply voltage Vdd, forcing the output of the second inverter 3 to logical "1". Now a voltage drop (Vdd to output voltage inverter 1) across the blown fuse 2 occurs.

Figure 3:
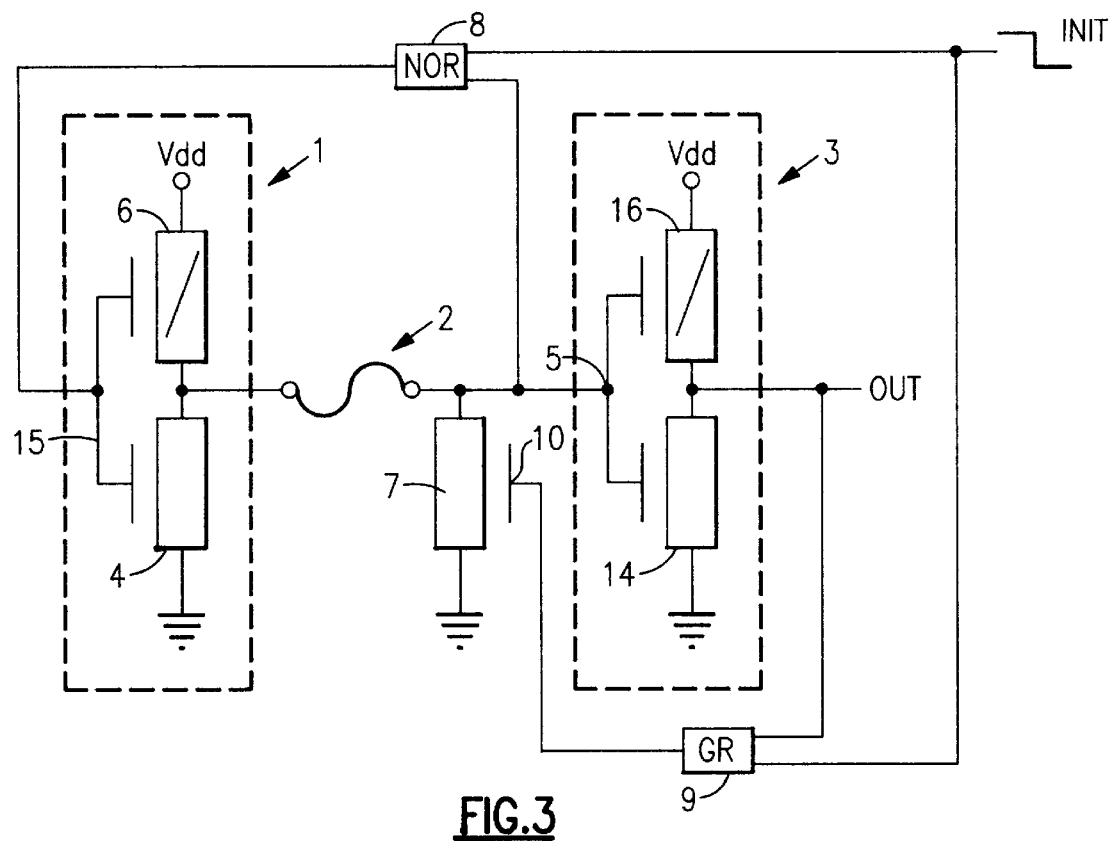
FIG. 3 depicts a design of a zero volt/zero current fuse arrangement according to the invention.

The design in FIG. 3 shows, according to the invention, the solution to overcome the voltage and current problems described above.

Although the invention is hereinafter described in connection with interconnect layers made of copper, it will be clear to the skilled worker that it can also be used with other materials, such as aluminum, etc.

It will also be clear to those skilled in the art that the present invention is not restricted to CMOS processes, but can be used with all other chip manufacturing processes.

It can be seen that the first and second inverters 1, 3 are maintained in the design shown in FIG. 3. The fuse 2, however, is now connected between two NFETs 4, 7 of the same size. The NOR and OR circuits 8, 9, together with the INIT pulse will assure a correct state after power-on, which will be described below.

When the fuse 2 is intact, the INIT line being a logical "1" will bring the NOR circuit 8 output to a logical "0" and therefore the output of the inverter 1 to a logical "1". As this output is fed back—over the intact fuse 2—to the other input of the NOR circuit 8, the ring NOR 8—PFET 6—FUSE 2—NOR 8 input will not change state anymore even after the INIT line goes to "0" again. NFET 7 will draw current (as in the previous design) when INIT is logically "1", but afterwards 7 will close. The inverter 3 output ("OUT") is a logical "0". PFET 6 must have a large Width/Length (W/L) ratio and NFET 7 must have a small W/L ratio in order to make sure that, with an intact fuse, the gate's voltage potential of inverter 3 will be high enough to be recognized as a logical "1" at the NOR 8 input to stabilize the above mentioned ring.

When the fuse is blown, the output of inverter 1 has no influence on the inverter 3 input node anymore as there exists no connection between the two inverters. When INIT=logical "1", the OR 9 output will be "1" and therefore the gate 10 of NFET 7. This NFET will bring the inverter 3 input to a logical "0", the output will go high and now the ring OR 9—NFET 7—inverter 3—OR 9 input will not change state anymore even after the INIT line goes to "0" again. The output of inverter 3 ("OUT") is a "1". When the INIT line is "0" both inputs of the NOR 8 are logical "0", forcing a logical "1" at the gate 15 of inverter 1 and therefore a "0" at the output of inverter 1. Thus both ends of the blown fuse have equal logical values ("0"). A different voltage potential on both ends of the blown fuse will be prohibited when NFET 4 and 7 are the same. In IC technology this is achieved very easily when the W/L dimensions are equal and the transistors are placed next to each other. Accordingly, dendritic growth will not only be reduced but completely prevented and the copper atoms will not be able to travel across the blown fuse and thus there is no possibility to "regrow" the fuse again.

The INIT signal is necessary as the circuitry consists of two coupled memory elements: the NOR 8 together with inverter 1 forms a first latch (when the fuse 2 is intact); and the inverter 3 with NFET 7 (connected via the OR 9) forms a second latch coupled to the first one. At power-on these two latches could go into either state when the INIT signal would not be present; i.e. logically as if INIT="0". For example the NOR 8 output could be "1" and therefore the inverter 1 output "0". This value is fed back—over the intact fuse—to the NOR 8 input and would stabilize the above mentioned NOR ring. At the same time the output of inverter 3 would be "1" and fed back—via OR 9—to the gate 10 of NFET 7. The above mentioned OR ring would also stabilize, but, with an intact fuse, at the wrong state.

Figure 4:
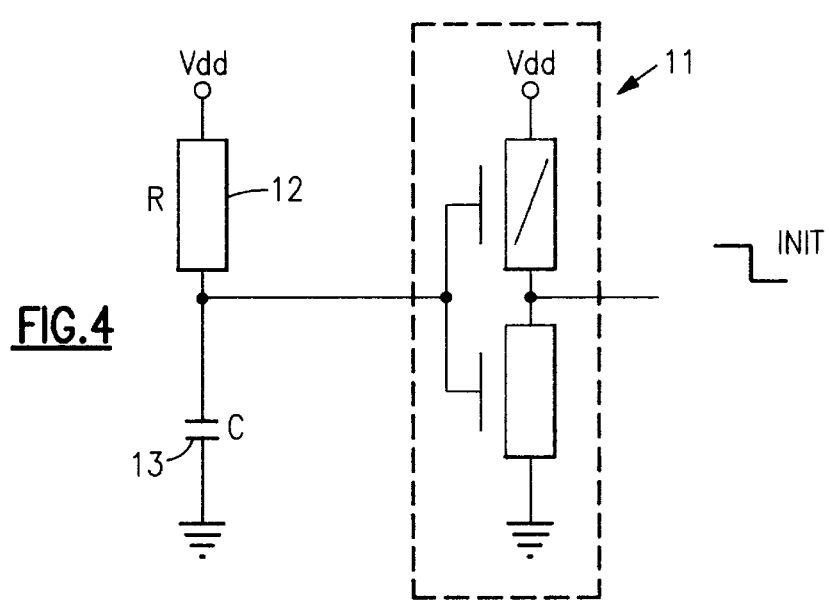
FIG. 4 shows a circuitry to supply an INIT pulse.

To make sure that the memory elements fall into the correct state at power-on (depending on a blown/not blown fuse) the INIT line must remain a logical "1" at least as long as the time necessary to stabilize the ring (see above). If such a signal is not available in the logic chip design yet, it can, e.g., be obtained from a capacitor (with a resistor to Vdd) with an inverter. Such an approach is shown in FIG. 4. The values of resistor 12 and capacitor 13 must be chosen large enough to guarantee that the gate of inverter 11 will remain a logical "0" longer than the above mentioned time to stabilize the ring. As in the present technology this will be in the order of 100 to 200 ps the resistor value could for example be chosen to be 1 KOhm and the capacitor value 1 pF.

The design according to the invention does not produce pulses where its lengths determine a correct or incorrect functioning of the circuit. It does not contain internal delay lines that must be inside a narrow window to have the circuit function correctly. During the INIT line being logical high the circuit can be left on its own and will always produce a correct result.

Thus the proposed fuse arrangement will not be timing critical. The fact that there is no current when using the circuit according to the invention may become important during the Idd test of a chip to find deficiencies. The design is easy, uncritical and can be directly scaled to future technologies.

In addition, the design according to the invention will consume very little silicon.

What is claimed is:

1. A zero volt/zero current fuse arrangement for use in integrated circuits comprising two latches having inverter circuits coupled to each other and a fuse having a first and second terminal, characterized in that the first latch is formed by a first inverter having its output connected to said first terminal of said fuse and a NOR circuit having one of its inputs connected to the second terminal of said fuse and the second latch is formed by an NFET circuit connected to the second terminal of said fuse and a second inverter connected to the second terminal of said fuse for coupling to said first latch, and apart from power on, the arrangement will not draw any DC current, and the first and second inverters are both formed of a PFET and an NFET, and the PFET of the first inverter has a large Width/Length ratio, and the NFET of the first inverter and the said NFET circuit of the second latch have a small Width/Length ratio and are of the same size such that said large and small Width/Length ratios are determined that, with an intact fuse, the voltage potential at the second inverter's input will also be recognized as a logical "1" at said NOR input.

2. The zero volt/zero current fuse arrangement of claim 1 wherein both ends of the fuse have the same voltage potential when the fuse has been blown.

3. The zero volt/zero current fuse arrangement of claim 2, wherein, apart from power on, the arrangement will not draw any DC current.

* * * * *